(12) United States Patent
Sin et al.

(10) Patent No.: US 9,647,077 B2
(45) Date of Patent: May 9, 2017

(54) POWER SEMICONDUCTOR DEVICES HAVING A SEMI-INSULATING FIELD PLATE

(71) Applicant: HKG Technologies Limited, Hong Kong (HK)

(72) Inventors: Johnny Kin-On Sin, Hong Kong (HK); Iftikhar Ahmed, Hong Kong (HK); Chun-Wai Ng, Hong Kong (HK)

(73) Assignee: JSAB TECHNOLOGIES LIMITED, Hong Kong (HK)

(*) Notice: Subject to any disclaimer, the term of this patent is extended or adjusted under 35 U.S.C. 154(b) by 0 days.

(21) Appl. No.: 14/655,717

(22) PCT Filed: Dec. 10, 2014

(86) PCT No.: PCT/IB2014/066747
§ 371 (c)(1),
(2) Date: Jun. 25, 2015

(87) PCT Pub. No.: WO2015/097581
PCT Pub. Date: Jul. 2, 2015

(65) Prior Publication Data
US 2016/0087050 A1    Mar. 24, 2016

(30) Foreign Application Priority Data
Dec. 23, 2013 (HK) .................... 13114186

(51) Int. Cl.
*H01L 29/40* (2006.01)
*H01L 23/00* (2006.01)
(Continued)

(52) U.S. Cl.
CPC ............ *H01L 29/405* (2013.01); *H01L 24/46* (2013.01); *H01L 29/0619* (2013.01);
(Continued)

(58) Field of Classification Search
CPC ... H01L 29/402; H01L 29/404; H01L 29/405; H01L 29/41758; H01L 29/41708
See application file for complete search history.

(56) References Cited

U.S. PATENT DOCUMENTS

| | | | | |
|---|---|---|---|---|
| 4,691,223 A * | 9/1987 | Murakami | ............ | H01L 29/405 257/168 |
| 5,086,332 A * | 2/1992 | Nakagawa | ............ | H01L 29/405 257/380 |

(Continued)

OTHER PUBLICATIONS

Chong, Electrical Characterization of N-Type Gallium Nitride grown by Metalorganic Vapor deposition on Sapphire, Yale University, 2000 p. 4.*

*Primary Examiner* — Dale E Page
*Assistant Examiner* — John Bodnar

(57) ABSTRACT

A power semiconductor device comprising a first metal electrode and a second metal electrode formed on a first substrate surface of a semiconductor substrate, a semi-insulating field plate interconnecting said first and second metal electrodes, and an insulating oxide layer extending between said first and second metal electrodes and between said field plate and said semiconductor substrate, wherein said semi-insulating field plate is a titanium nitride (TiN) field plate.

15 Claims, 4 Drawing Sheets

(51) Int. Cl.
*H01L 29/78* (2006.01)
*H01L 29/73* (2006.01)
*H01L 29/417* (2006.01)
*H01L 29/423* (2006.01)
*H01L 29/06* (2006.01)
*H01L 29/861* (2006.01)
*H01L 29/732* (2006.01)

(52) U.S. Cl.
CPC .. *H01L 29/41708* (2013.01); *H01L 29/41758* (2013.01); *H01L 29/42304* (2013.01); *H01L 29/42356* (2013.01); *H01L 29/73* (2013.01); *H01L 29/732* (2013.01); *H01L 29/78* (2013.01); *H01L 29/7811* (2013.01); *H01L 29/7816* (2013.01); *H01L 29/7823* (2013.01); *H01L 29/8611* (2013.01); H01L 2224/4502 (2013.01); H01L 2924/00014 (2013.01); H01L 2924/1301 (2013.01); H01L 2924/1305 (2013.01); H01L 2924/13055 (2013.01); H01L 2924/13091 (2013.01)

(56) References Cited

U.S. PATENT DOCUMENTS

| | | | | |
|---|---|---|---|---|
| 5,814,860 | A * | 9/1998 | Furuta | H01L 24/05 257/335 |
| 6,100,572 | A * | 8/2000 | Kinzer | H01L 29/0615 257/339 |
| 2003/0049919 | A1* | 3/2003 | Yamamoto | H01L 21/28052 438/592 |
| 2003/0124842 | A1* | 7/2003 | Hytros | C23C 16/34 438/680 |
| 2004/0262702 | A1* | 12/2004 | Herner | H01L 21/28088 257/411 |
| 2007/0210350 | A1* | 9/2007 | Omura | H01L 23/4824 257/287 |
| 2009/0230429 | A1* | 9/2009 | Miyamoto | H01L 29/402 257/192 |
| 2012/0168909 | A1* | 7/2012 | Patti | H01L 29/402 257/565 |
| 2013/0228788 | A1* | 9/2013 | Yamamura | H01L 29/2003 257/76 |

* cited by examiner

POWER SEMICONDUCTOR DEVICES HAVING A SEMI-INSULATING FIELD PLATE

FIELD

The present disclosure relates to power semiconductor devices.

BACKGROUND

Power semiconductor devices having a high breakdown voltage and a low leakage current is desirable.

SUMMARY

According to the disclosure, there is provided a power semiconductor device comprising a first metal electrode and a second metal electrode formed on a first substrate surface of a semiconductor substrate, a semi-insulating field plate interconnecting said first and second metal electrodes, and an insulating oxide layer extending between said first and second metal electrodes and between said field plate and said semiconductor substrate. The semi-insulating field plate is a titanium nitride (TiN) field plate. A power semiconductor device having a titanium nitride (TiN) field plate has a good breakdown voltage and with good off-state leakage current characteristics.

The TiN field plate may be fabricated by deposition after metallization of the power semiconductor device. After TiN deposition, the TiN layer thus formed is on top of both the silicon oxide layer and the metal electrodes. This post-metallization deposition process alleviates the problem of furnace contamination compared to the deposition of amorphous silicon.

Where the titanium nitride (TiN) field plate is formed by deposition, the titanium nitride (TiN) field plate is a layer of titanium nitride (TiN) deposition covering the first electrode, the second electrode and the oxide layer except at contact accesses to said first electrode and said second electrode.

TiN has a relatively low resistivity of around $10^{-4}$ ohm-cm and has been used as conducting materials in integrated circuits (IC) having a thickness in the order of 1 um. By forming a field plate having a TiN film with an ultra-low thickness (e.g., 10 nm or below), the field plate is semi-insulating. As leakage current is approximately proportional to the thickness of the TiN film, the thickness of the semi-insulating TiN film is to be kept as low as possible. The use of semi-insulating TiN to form a field plate or as a field plate forming material is advantageous since the deposition of TiN does not required a high temperature. The relatively low deposition temperature of TiN, which is below the melting temperature of aluminium, mitigates contamination to the device wafer and is desirous.

BRIEF DESCRIPTION OF THE DRAWINGS

The disclosure will be described by way of example with reference to the accompanying Figures, in which.

DETAILED DESCRIPTION

Figure 1:
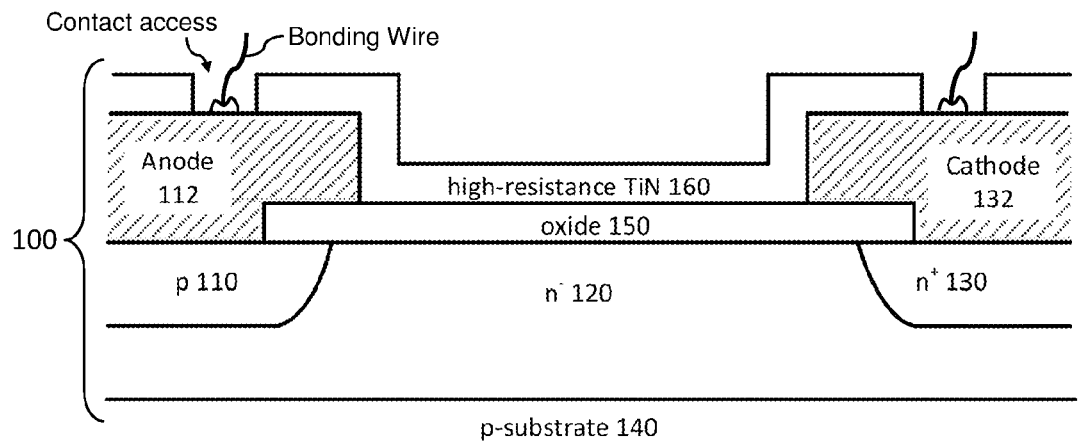
FIG. 1 is a schematic diagram depicting a cross-sectional view of an example power semiconductor device according to the present disclosure.

An example power diode 100 having a lateral structure is depicted in FIG. 1. The example power diode as an example power semiconductor device has a lateral structure and includes a p-anode region 110, an $n^-$-drift region 120 and an $n^+$-cathode region 130. The p-anode region, the $n^+$-cathode region and the $n^-$-drift region are formed near the top surface of a p-type semiconductor substrate 140. As depicted in FIG. 1, the anode region is formed on a first lateral side, the cathode region is formed on a second lateral side distal to the first, and the drift region interconnects the anode region and the cathode region. The drift region extends downwards towards the p-type semiconductor substrate as well as sideways such that the drift region is between the $n^+$-cathode region and the p-anode region and between the $n^+$-cathode region and the semiconductor substrate. A first metal electrode in direct contact with the p-anode region is formed on the top surface of the p-type semiconductor substrate 140 and projects upwardly away from the p-anode region and the p-type semiconductor substrate 140 to form the anode 112. A second metal electrode in direct contact with the $n^+$-cathode region is formed on the top surface of the p-type semiconductor substrate 140 and projects upwardly away from the $n^+$-cathode region and the p-type semiconductor substrate 140 to form the cathode 132.

An oxide layer 150 extends laterally between the anode and the cathode and forms a bridge interconnecting the p-anode region and the $n^+$-cathode region. The oxide layer 150 is in abutment with the top surface of the $n^-$-drift region 120 as it extends between the anode and the cathode. A first lateral portion of the oxide layer 150 projects laterally into the anode 112 and directly above the p-anode region, such that the first lateral portion is sandwiched between the p-anode region and the anode. A second lateral portion of the oxide layer 150 projects laterally into the cathode 132 and directly above the $n^+$-cathode region, such that the second lateral portion is sandwiched between the $n^+$-cathode region 130 and the cathode 132.

A field plate 160 is formed on a top surface of the power diode and covers the anode, the cathode and the portion of the oxide layer which is outside the anode and the cathode. The field plate comprises a titanium nitride layer having a thickness below 10 nm and a resistivity of around $10^{-4}$ ohm-cm. Resistivity of the TiN field plate layer can be adjusted by controlling its density, and the ratio of nitrogen to titanium as known in the art. Thickness of the TiN field plate layer can be adjusted by controlling its deposition time and temperature. The thickness of TiN is kept low (e.g., below 10 nm) to make the TiN plate semi-insulating. The high-resistivity titanium nitride TiN field plate may be formed by plasma-enhanced chemical vapour deposition (PECVD) of titanium nitride TiN after the metal anode and cathode have been formed.

When the device is in an OFF state, current will flow from the cathode 132 to the anode 112. As the field plate is made of a highly resistive material, this current flow will generate a linear voltage drop across the length of the field plate and between the cathode and the anode. This linear voltage drop profile between the cathode 132 and the anode 112 results in the generation of a uniform or substantially uniform electric field at the surface of the n^--drift region 120.

This uniform electric field reduces the peak electric field near the p-anode and/or n+-cathode (13), and helps to improve the breakdown voltage performance of the diode. The high resistivity of TiN layer at high temperatures also mitigates leakage current at high temperatures.

Figure 2:
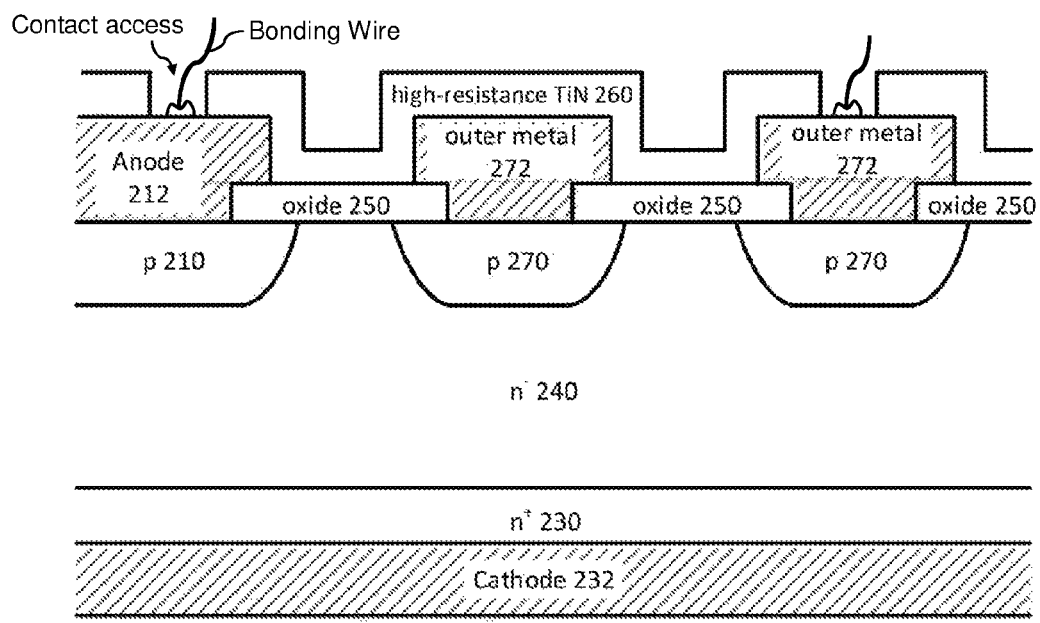
FIG. 2 is a schematic diagram depicting a cross-sectional view of another example power semiconductor device according to the present disclosure.

An example power diode 200 having a vertical structure is depicted in FIG. 2. The example power diode comprises a p-anode region 210, an n^--drift region 240, an n^+-cathode region 230 and a plurality of guard rings 270 of p type conductivity (or p-guard rings at the junction termination. The p-anode region, the n^--drift region and the plurality of guard rings 270 are formed on the top surface of the n^--drift region 240.

The p-anode region 210 is formed on one lateral side on the top surface of the n-type n^--drift region 240. The p-guard rings 270 are distributed in a lateral direction along the top surface of the n^--drift region 240 and sequentially away from the p-anode region 210. Each of the p-guard ring 270 extends from the top surface of the n^--drift region 240 to a depth below the top surface. The n^+-cathode region 230 is formed on the bottom surface of the n^--drift region 240, the bottom surface being distal from the top surface.

The n^--drift region extends downwards towards the n-type semiconductor substrate as well as sideways such that the drift region is between the p-anode region and the n-type semiconductor substrate and between the p-guard ring region 270 and the n-type semiconductor substrate.

A first metal electrode in direct contact with the p-anode region is formed on the top surface of the n-type semiconductor substrate 240 and projects upwardly away from the p-anode region and the n-type semiconductor substrate 240 to form the anode 212. A second metal electrode in direct contact with the p-guard ring region 270 is formed on the top surface of the n^--drift region 240 and projects upwardly away from the p-guard ring region 270 and the n^--drift region 240 to form an outer metal electrode 272. A third metal electrode in direct contact with the n^+-cathode region 230 is formed below the bottom surface of the n^--drift region 240 and projects downwardly away from the n^+-cathode region 230 and the n^--drift region 240 to form the cathode 232.

An oxide layer 250 extends laterally between the anode and the guard ring and forms a bridge interconnecting the p-anode region and the p-guard ring. The oxide layer 250 is in abutment with the top surface of the n^--drift region 240 as it extends between the anode and the guard ring. A first lateral portion of the oxide layer 250 projects laterally into the anode 212 and directly above the p-anode region, such that the first lateral portion is sandwiched between the p-anode region 210 and the p-anode 212. A second lateral portion of the oxide layer 250 projects laterally into the outer metal electrode 272 and directly above the p-guard ring region 270, such that the second lateral portion is sandwiched between the p-guard ring region 270 and the outer metal electrode 272.

A field plate 260 is formed on a top surface of the power diode and covers the anode, the outer metal electrodes 272 and the portion of the oxide layer which is outside the anode and outer metal electrodes 272. The field plate comprises a titanium nitride layer having a thickness of between 5 nm to 100 nm and a resistivity of between 100 ohm-cm to 10,000 ohm-cm. Resistivity of the TiN field plate layer can be adjusted by controlling its density and the ratio of nitrogen to titanium as known in the art. The highly resistive titanium nitride TiN field plate may be formed by deposition of titanium nitride TiN after the metal anode and outer metal electrodes 272 have been formed.

When the device is in an OFF state, current will flow from the cathode 232 to the outer metal electrode 272 and then to the source electrode 212. As the field plate is made of a highly resistive material, this current flow will generate a linear voltage drop across the length of the field plate and between the guard ring(s) and source. This linear voltage drop profile between the guard ring(s) and source results in the generation of a uniform or substantially uniform electric field at the surface of the n^--drift region 240.

This uniform electric field reduces the peak electric field near the p-anode and/or the guard ring, and helps to improve the breakdown voltage performance of the diode. The high resistivity of TiN layer at high temperatures also mitigates leakage current at high temperatures.

Figure 3:
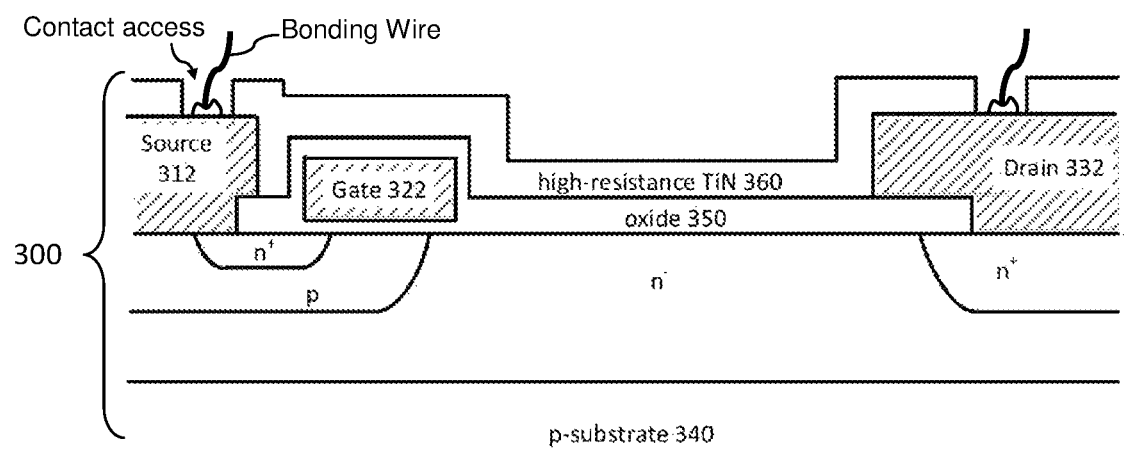
FIG. 3 is a schematic diagram depicting a cross-sectional view of an example power MOSFET according to the present disclosure.

An example power MOSFET 300 according to the present disclosure is depicted in FIG. 3. The example power MOSFET 300 is a lateral double-diffused MOSFET (LDMOS) comprising a source terminal 312, a gate terminal 322 and a drain terminal 332 which are formed on one top surface of a p-type semiconductor substrate 340.

When the device is in an OFF state, current will flow from the drain 332 to the source 312. As the field plate is made of a highly resistive material, this current flow will generate a linear voltage drop across the length of the field plate and between the cathode and the anode. This linear voltage drop profile between the drain 332 and the source 312 results in the generation of a uniform or substantially uniform electric field at the surface of the n^--drift region 340.

An oxide layer 350 extends laterally between the source terminal 312 and the drain terminal 322 and surrounds the gate terminal. The oxide layer 350 forms an oxide bridge which extends between the source terminal 312 and the drain terminal 332.

The oxide layer 350 is in abutment with the top surface of an n^-drift region formed on the p-type semiconductor substrate 340 as it extends between the source terminal 312 and the drain terminal 332. A first lateral portion of the oxide layer 350 projects laterally into the source terminal and directly above the source region, such that the first lateral portion is sandwiched between the source region and the p-body. A second lateral portion of the oxide layer 350 projects laterally into the drain terminal 332 and directly above the n^+-drain region, such that the second lateral portion is sandwiched between drain terminal 332 and the n^+-drain region.

A field plate 360 is formed on a top surface of the MOSFET 300 and covers the source terminal 312, the drain terminal 332 and the portion of the oxide layer which is outside source terminal 312, the drain terminal 332. The field plate comprises a titanium nitride layer having a thickness below 10 nm and a resistivity of around $10^{-4}$ ohm-cm. Resistivity of the TiN field plate layer can be adjusted by controlling its density and the ratio of nitrogen to titanium as known in the art. The highly resistive titanium nitride TiN field plate may be formed by deposition of titanium nitride TiN after the source and drain metal electrodes have been formed.

Figure 4:
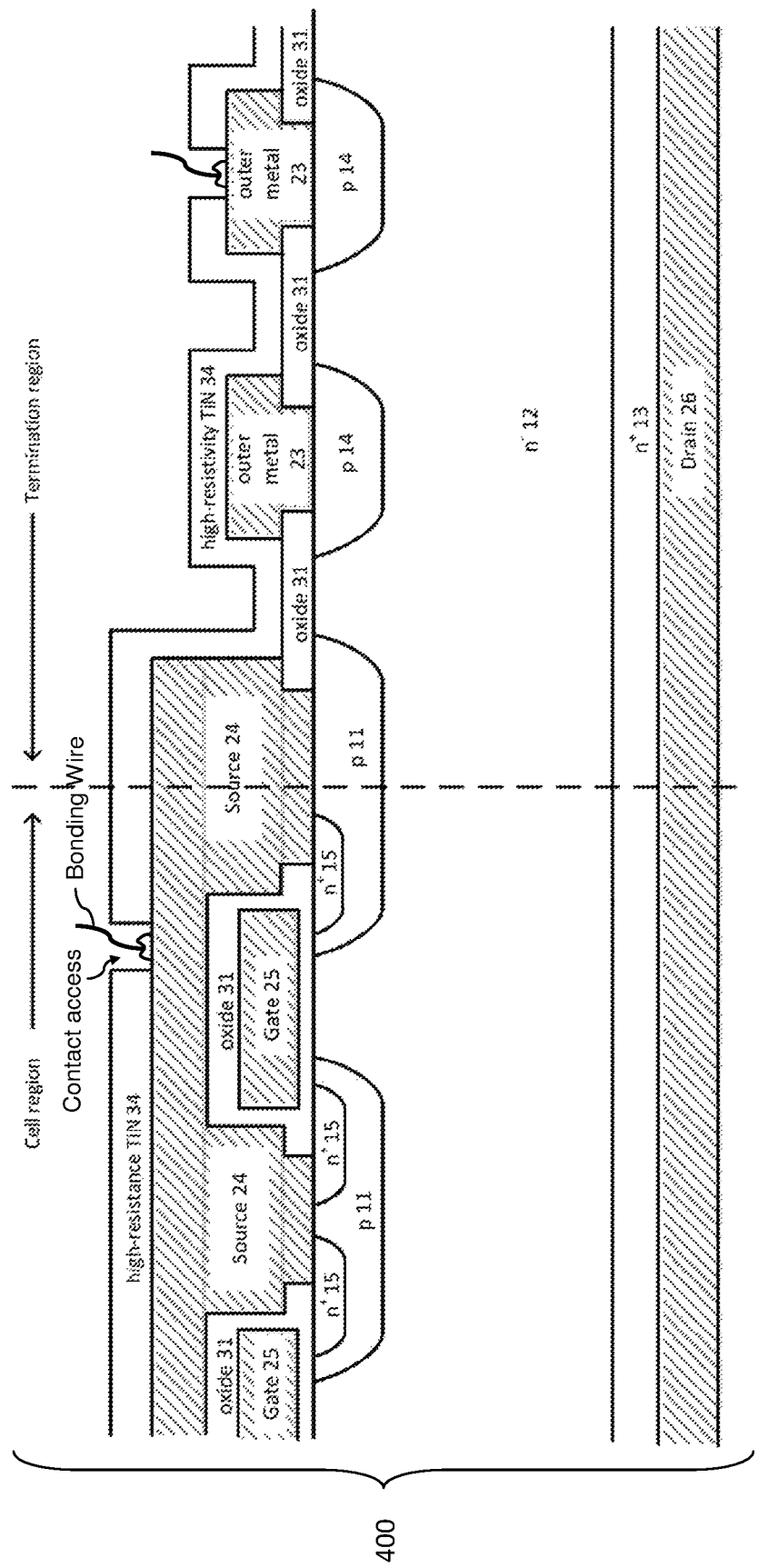
FIG. 4 is a schematic diagram depicting a cross-sectional view of an example vertical power MOSFET according to the present disclosure.

An example power MOSFET 400 according to the present disclosure is depicted in FIG. 4. The example power MOSFET 400 is a vertical power MOSFET comprising a cell region and a termination region. The termination region has a similar structure as that of the diode device 200. Due to the same mechanism as that in device 200, the TiN field plate helps to improve the breakdown voltage performance of the vertical power MOSFET. The example device 400 is designed to sustain a breakdown voltage of 900V. The n⁻-drift region 12 has a resistivity of around 35 ohm-cm and a thickness of around 70 um. The p guard rings 14 have a junction depth of around 6 um, and the oxide 31 has a thickness of around 1 um. The TiN is deposited by PECVD for 3 seconds to result in a thickness of around 1 nm. At the off-state, the TiN results in a leakage current of around 1 uA at 900V at room temperature, which is acceptable for most applications. Compared to the device without TiN field plate, the BVdss of this example device is enhanced by around 100 V.

In some embodiments, the TiN layer may be relatively thin, for example at around 1 or 2 nm, and bonding wires may pass through or penetrate the TiN layer on the source electrode during packaging of the device. In some embodiments, connection between the electrode(s) regions on the semiconductor and bonding wire(s) may be formed by patterning on the TiN layer, for example by using passivation masks.

Figure 5:
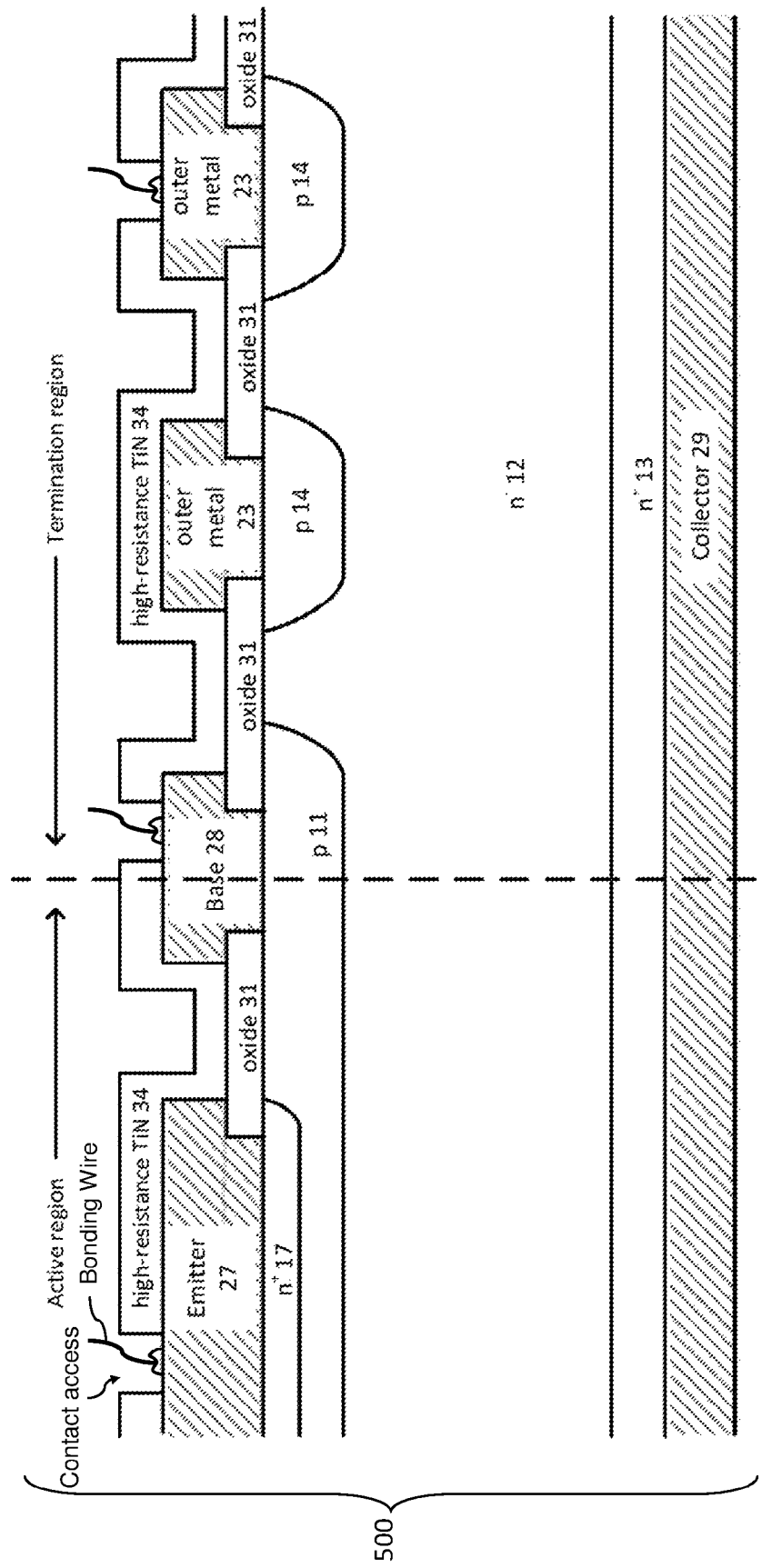
FIG. 5 is a schematic diagram depicting a cross-sectional view of an example vertical bipolar junction transistor (BJT) according to the present disclosure.

An example power BJT 500 according to the present disclosure is depicted in FIG. 5. The example power BJT 500 is a vertical power BJT comprising an active region and a termination region. The termination region has a similar structure as that of the diode device 200. Due to the same mechanism as that in device 200, the TiN field plate helps to improve the breakdown voltage performance of the vertical power BJT.

While the present disclosure has been explained with reference to the above example devices, it should be appreciated that the examples are to assist understanding of the disclosure and not to limit scope of disclosure.

The invention claimed is:

1. A power semiconductor device comprising a first metal electrode and a second metal electrode formed on a first substrate surface of a semiconductor substrate, a length of semi-insulating field plate interconnecting said first and second metal electrodes, and an insulating oxide layer extending between said first and second metal electrodes and between said field plate and said semiconductor substrate, wherein said semi-insulating field plate is a titanium nitride (TiN) field plate having a resistivity of between 100 ohm-cm and 10,000 ohm-cm and a thickness of 10 nm or less.

2. A power semiconductor device according to claim 1, wherein the first metal electrode is connected to a semiconductor region having a first conductivity type and the second metal electrode is connected to a semiconductor region having a first conductivity type or a second conductivity type.

3. A power semiconductor device according to claim 1, further comprising a third metal electrode on a second substrate surface of the semiconductor substrate, the second substrate surface being distal from the first substrate surface, wherein the third metal electrode is connected to a semiconductor region having a second conductivity type.

4. A power semiconductor device according to claim 1, wherein the titanium nitride (TiN) field plate is a layer of titanium nitride (TiN) deposition covering the first electrode, the second electrode and the oxide layer except at contact accesses to said first electrode and said second electrode.

5. A power semiconductor device according to claim 4, wherein contact accesses include a first bonding wire which extends from said first electrode and projects through said field titanium nitride (TiN) field plate to facilitate external connection to said first electrode and a second bonding wire which extends from said second electrode and projects through said field titanium nitride (TiN) field plate to facilitate external connection to said second electrode.

6. A power semiconductor device according to claim 1, wherein the titanium nitride field plate is formed by plasma-enhanced chemical vapour deposition.

7. A power semiconductor device according to claim 1, wherein the semiconductor device is a MOSFET having a cell region comprising a source electrode as the first metal electrode and a termination region comprising an outer metal electrode as the second metal electrode.

8. A power semiconductor device according to claim 1, wherein the semiconductor device is a lateral double-diffused MOSFET (LDMOS) having its source electrode as the first metal electrode, its drain electrode as the second metal electrode.

9. A power semiconductor device according to claim 1, wherein the semiconductor device is a bipolar junction transistor (BJT) having an active region comprising a base electrode as the first metal electrode and a termination region comprising an outer metal electrode as the second metal electrode.

10. A power semiconductor device according to claim 1, wherein the semiconductor device is a LDMOS, a vertical power MOSFET, a power BJT or a power diode.

11. A power semiconductor device according to claim 1, wherein the titanium nitride field plate has a thickness of between 5 nm and 100 nm.

12. A power semiconductor device according to claim 1, wherein the semi-insulating field plate is such that when the device is in an off state and current flows through the semi-insulating field plate between said first and second metal electrodes, a linear voltage drop profile is generated across the length of the semi-insulating field plate and between said first and second metal electrodes.

13. A power semiconductor device according to claim 1, wherein the device includes a first electrode region connected to the first metal electrode at a first lateral side, a second electrode region connected to the second metal electrode at a second lateral side, and a semiconductor drift region interconnecting the first electrode region and the second electrode region; and wherein the semi-insulating field plate is such that when the device is in an off state and a current flows through the length of the semi-insulating field plate, a uniform or substantially uniform electric field is generated at a surface of the drift region near the first and second metal electrodes.

14. A power semiconductor device according to claim 1, wherein the semiconductor device is a lateral double-diffused MOSFET (LDMOS) comprising a source terminal, a gate terminal and a drain terminal formed which are formed on a top surface of a semiconductor substrate; and wherein the source terminal and the drain terminal are connected by the length of the semi-insulating field plate such that when the MOSFET is in its off state and current flows between the source terminal and the drain terminal and across the length of the semi-insulating field plate, a linear voltage drop profile between the source terminal and the drain terminal is generated and a uniform or substantially uniform electric field is developed on the top surface.

15. A power semiconductor device according to claim 1, wherein the semiconductor device is a vertical power MOSFET including a cell region which comprises a source terminal and a termination region which comprises at least one outer metal terminal which is formed immediately above a guard ring, the source terminal and the outer metal terminal being formed above a top surface of a semiconductor substrate; wherein the semi-insulating field plate connects the source terminal and the outer metal terminal such that when the MOSFET is in its off state and current flows across the length of the semi-insulating field plate between the source terminal and the guard ring, a linear voltage drop profile between the source terminal and the guard ring and a uniform or substantially uniform electric field on the top surface of the semiconductor substrate is generated.

* * * * *